(12) United States Patent
Zhong et al.

(10) Patent No.: US 12,124,787 B2
(45) Date of Patent: Oct. 22, 2024

(54) SYSTEM AND METHOD FOR AUTOMATIC GENERATION OF DEVICE-BASED DESIGN RULES AND CORRESPONDING DESIGN RULE CHECKING (DRC) CODES

(71) Applicant: GlobalFoundries Singapore Pte. Ltd., Singapore (SG)

(72) Inventors: Shu Zhong, Singapore (SG); Ming Zhu, Singapore (SG); Pinghui Li, Singapore (SG); Yiang Aun Nga, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 568 days.

(21) Appl. No.: 17/519,635

(22) Filed: Nov. 5, 2021

(65) Prior Publication Data

US 2023/0144064 A1     May 11, 2023

(51) Int. Cl.
*G06F 30/398* (2020.01)
*G06F 16/22* (2019.01)

(52) U.S. Cl.
CPC ........ *G06F 30/398* (2020.01); *G06F 16/2282* (2019.01)

(58) Field of Classification Search
CPC .......................... G06F 30/398; G06F 16/2282
USPC ........................................................ 716/112
See application file for complete search history.

(56) References Cited

U.S. PATENT DOCUMENTS

| 6,063,132 | A | 5/2000 | DeCamp et al. |
| 6,378,110 | B1 | 4/2002 | Ho |
| 6,606,735 | B1 * | 8/2003 | Richardson ........... G06F 30/398 716/112 |

(Continued)

FOREIGN PATENT DOCUMENTS

| CN | 102663169 A | 9/2012 |
| EP | 3719677 A1 * | 10/2020 |

OTHER PUBLICATIONS

Ravve, Elena V., "Template Based Automatic Generation of DRC and LVS Runsets," International Journal on Advances in Software, vol. 10, No. 1 & 2, 2017, pp. 143-154.

*Primary Examiner* — Suresh Memula
(74) *Attorney, Agent, or Firm* — David Cain; Hoffman Warnick LLC

(57) ABSTRACT

Disclosed are a system and method for automatically and systematically generating device-based design rules and corresponding device-based design rule checking (DRC) codes. In the system and method, design rules associated with specific devices are generated based on at least one table of related data (e.g., maturity status information, restriction status information, etc.) for different devices. Based on the design rules and on unique definitions for the specific devices, design rule checking (DRC) codes associated with the specific devices are generated. By using this approach, comprehensive and accurate device-based design rules and corresponding device-based DRC codes can be quickly generated to ensure acceptable product reliability and yield. Furthermore, processes used to generate the device-based DRC codes can be iteratively repeated (e.g., when the information used for generating the unique definitions of devices and/or generating the design rules changes) to update the device-based DRC codes and, thereby ensure DRC accuracy.

20 Claims, 8 Drawing Sheets

(56) References Cited

U.S. PATENT DOCUMENTS

| | | | |
|---|---|---|---|
| 6,611,946 B1* | 8/2003 | Richardson | G06F 30/398 |
| | | | 716/112 |
| 6,732,338 B2 | 5/2004 | Crouse et al. | |
| 6,735,749 B2 | 5/2004 | Li et al. | |
| 7,124,382 B1 | 10/2006 | Eccles et al. | |
| 7,406,671 B2 | 7/2008 | Corbeil, Jr. et al. | |
| 7,552,408 B2 | 6/2009 | Teh et al. | |
| 8,875,064 B2 | 10/2014 | Aggarwal et al. | |
| 8,984,458 B2 | 3/2015 | Giffel | |
| 9,594,866 B2 | 3/2017 | Wang et al. | |
| 10,922,462 B1* | 2/2021 | Chen | G06F 30/30 |
| 2003/0061583 A1 | 3/2003 | Malhotra | |
| 2003/0220770 A1 | 11/2003 | Eikyu | |
| 2005/0223347 A1 | 10/2005 | Okuaki | |
| 2015/0113489 A1* | 4/2015 | Chuang | G06F 30/398 |
| | | | 716/112 |
| 2020/0104457 A1* | 4/2020 | Chuang | G06F 30/392 |
| 2021/0110095 A1 | 4/2021 | Zhang | |
| 2023/0385521 A1* | 11/2023 | Chuang | G06N 20/00 |

* cited by examiner

| Device | Device definition |
|---|---|
| slvtnfet | (((nFETGate AND (SLVT OR GY)) NOT LVS_TRUE5T6T) NOT (ESD_HBM OR (ESD_CDM OR ESDSCR_HBM)) |
| slvtpfet | ((((pFETGate AND (SLVT OR IY)) NOT LVS_TRUE5T6T) NOT T3) NOT (ESD_HBM OR (ESD_CDM OR ESDSCR_HBM)) |
| lvthnfet | (((nFETGate AND (LVT OR XW)) NOT LVS_TRUE5T6T) NOT (ESD_HBM OR (ESD_CDM OR ESDSCR_HBM)) |
| ... | ... |
| dgnfet | (((nFETGate AND DG) NOT LVS_TRUE5T6T) NOT (OR DGV OVERDRIVE ZVT ESD_HBM ESD_CDM ESDSCR_HBM) |

FIG. 2

TABLE OF MATURITY STATUS FOR SPECIFIC DEVICES

| DEVICE | GRADE-SPECIFIC MATURITY STATUS | | | |
|---|---|---|---|---|
| | Consumer | ATV G1 | ATV G0 | ... |
| slvtnfet | Qualified | Frozen | Development | |
| slvtpfet | Qualified | Qualified | Frozen | |
| lvtnfet | Qualified | Qualified | Frozen | |
| lvtpfet | Qualified | Qualified | Frozen | |
| egnfet | Qualified | Not offered | Not offered | |
| ... | ... | ... | ... | |
| dgvnfet | Qualified | Qualified (Restricted) | Frozen | |
| dgvpfet | Qualified | Qualified | Frozen | |

FIG. 3A

TABLE OF RESTRICTION STATUS FOR SPECIFIC DEVICES

| DEVICE | LAYER OR DEVICE-SPECIFIC RESTRICTION STATUS | | | | |
|---|---|---|---|---|---|
| | RX | NW | T3 | ... | NR |
| slvtnfet | 1 | 0 | x | ... | 0 |
| slvtpfet | 1 | 1 | x | ... | 0 |
| lvtnfet | 1 | 0 | x | ... | 0 |
| lvtnfettw6t | 1 | 0 | 1 | ... | 0 |
| lvtpfet | 1 | 1 | x | ... | 0 |
| lvtpfet5t | 1 | 1 | 0 | ... | 0 |
| lvtpfettw5t | 1 | 1 | 1 | ... | 0 |
| nfet | 1 | 0 | x | ... | 0 |
| ... | ... | ... | ... | ... | ... |
| pfet5t | 1 | 1 | 0 | ... | 0 |
| dgnfet | 1 | 0 | x | ... | 0 |

FIG. 3B

MATURITY STATUS-RELATED DEVICE-BASED DESIGN RULES

| MATURITY STATUS | DEVICES |
|---|---|
| Frozen At ATV G1 (FRZ.ATVG1.C.99) | (slvtnfet, mdsrnfetwl_atv0, mdsrnfetwl_atv0, mdsrpfetpu_atv0, msrmfetwl_atv0, msrmpfetpd_atv0, msrmpfetpu_atv0, mdprnfetwl_atv0, mdprnfetpd_atv0, mdprpfetpu_atv0, lvtnfet_mmw, lvtnfet_mmw_6T, lvtpfet_mmw) devices are frozen in ATV G1 grade. |
| Not Offered At ATV G1 (NO.OFR.ATVG1.C.99) | (egvnfet, egvpfet, egnfet, egpfet, egpcap, hcvncap, hcvncap_atv0, srmnfetpd, dsrnfetwl, dsrpfetpu, srmnfetwl, srmnfetpd, srmpfetpu, dprnfetwl) devices are not offered in ATV G1 grade. |
| Qualified But Restricted At ATV G1 (RES.ATVG1.C.99) | (dgvnfet, dgldnfet, dgldpfet, dgldpfettw5t, dgxldnfet, dgxldpfet, dgxldpfettw5t) devices are restricted in ATV G1 grade. |
| ... | |
| Under Development At ATV G0 (DEV.ATVG0.C.99) | hvtnfet_t5v, hvacap_t5v, pmos_5p0_s_dw, pmos_5p0_s_dw_5T, nmos_5p0_aym_dw, nmos_5p0_aym_dw_6T, np_30p0_iso, pn_30p0_iso are under development at Auto G0 grade. |

FIG. 4A

RESTRICTION STATUS-RELATED DEVICE-BASED DESIGN RULES

| DEVICE | RESTRICTION STATUS |
|---|---|
| slvtnfet | slvtnfet touching union{NW, LVT, XW, LW, IY, HVT, NR, PR, EG, LIG, ZVT, EGV, DGV, OVERDRIVE, VPNP, IZ, OP, SBLK, NCAP or VAR, PCAP or VAR, BPMOAT, EFUSE, BIPOLAR, EQ, NWRES, BPNWR, PRES, ORES, POLY_SAL, DIFF_SAL, TIEDOWN, ESD_HBM or ESD_CDM, ESDSCR_HBM, ESDSH_S/N_DEVMARK, ESDSH_STK_DEVMARK, RP, SVHVFET, NOHALO, NOSD, SRAMHVT, AD, DNS_SRAM, LRG_SRAM, DPR_SRAM, CELLSNR, MR_SRAM, SRAM_ATV0, LVS_TRUESTGT, VNCAP2, DIODE, LBTRANS, TRANSMIS, OUTLINE_RF, OUTLINE_MMW, MIM_RF, MIM_MMWAVE, CHRT_RFFET, IRD, IRD_NONPSPI, IRD_UTM_MMW) is prohibited. |
| ... | |
| avtnfet | avtnfet touching union {NW, SLVT, GY, IY, LVT, XW, LW, HVT, NR, PR, EG, DGV, OVERDRIVE, ZVT, HZVT, SVHVFET, SVHVFET_ISO, IZ, OP, SBLK, NCAP or VAR, PCAP or VAR, BPMOAT, EFUSE, BIPOLAR, EQ, NWRES, BPNWR, PRES, DRES, POLY_SAL, DIFF_SAL, TIEDOWN, CELLSNR, AD, SRAMHVT, DNS_SRAM, LRG_SRAM, CPR_SRAM, MR_S3HVT, MR_SRAM, ESD_HBM or ESD_CDM1, ESDSCR_HBM4, ESDSH_S/N_DEVMARK, ESDSH_STK_DEVMARK, VPNP, RP, NOHALO, NOSD, AW, YP, YR, CG, FASLVT, AGCONT, GATED_CUS, LVS_TRUESTGT ) is prohibited. |

FIG. 4B

MATURITY STATUS-RELATED DEVICE-BASED DRC CODES

A. #IFDEF_AUTO_G1

(1) GRFRZ.ATVG1.C.99_slvtnfet {
@ slvtnfet device is frozen in ATV G1 grade.
slvtnfet = ((nFETGate AND (SLVT OR GY)) NOT LVS_TRUE5T6T) NOT (ESD_HBM OR (ESD_CDM OR ESDSCR_HBM))
COPY slvtnfet
}

(2) GRFRZ.ATVG1.C.99_mdsrnfetwl_atv0 {
@ mdsrnfetwl_atv0 device is frozen in ATV G1 grade.
mdsrnfetwl_atv0 = (((nFETGate AND AD) AND (CELLSNR AND SRAMHVT)) AND (DNS_SRAM AND SRAM_ATV0)) NOT (ULL_MK
COPY mdsrnfetwl_atv0
}

RESTRICTION STATUS-RELATED DEVICE-BASED DRC CODES

A. slvtnfet = ((nFETGate AND (SLVT OR GY)) NOT LVS_TRUE5T6T) NOT (ESD_HBM OR (ESD_CDM OR ESDSCR_HBM))

(1) GRTT0_slvtnfet_NW {
@ slvtnfet touching NW is prohibited.
slvtnfet INTERACT NW
}

(2) GRTT0_slvtnfet_LVT {
@ slvtnfet touching LVT is prohibited.
slvtnfet INTERACT LVT

SYSTEM AND METHOD FOR AUTOMATIC GENERATION OF DEVICE-BASED DESIGN RULES AND CORRESPONDING DESIGN RULE CHECKING (DRC) CODES

BACKGROUND

Field of the Invention

The present invention relates to integrated circuit (IC) design and, more particularly, to a system and method for automatically generating device-based design rules and corresponding design rule checking (DRC) codes.

Description of Related Art

For integrated circuit (IC) design and manufacturing, design rule sets are a series of constraints and requirements imposed on the IC design layout to ensure designs function properly, reliably, and can be produced with acceptable yield. Design rules are usually based with one or more design layers (i.e., layers drawn into the design layout). For example, there are design rules to check the minimum width and area of active silicon (RX) layer, or the minimum spacing between a polysilicon gate conductor (PC) layer and an RX layer, etc. Along with the design rules documentation for IC designers to refer to, there are programmed design rules checking (DRC) codes corresponding to the design rules that can be run on an IC verification DRC Electronic design automation (EDA) tool to realize automatic design rules checking in an IC layout. The DRC codes are usually created according to the design rules.

Among all the design rules, there is a category of the design rules regarding specific devices to ensure such devices can function properly and meet certain standard of reliability (e.g., design rule to check prohibited layers over a certain device, or channel length of a certain device, etc.). Such rules are usually manually created in which the devices are represented by one layer or more layers with Boolean operations among the layers. The indirect way of representing devices create difficulties for the readers to understand. Besides, there is not a systematic way to represent devices in design rule descriptions. Two or more devices could be represented by one piece of definition consisted of several layers if they have same property to be checked. But if the property becomes different for these devices, the definition of these devices needs to be split. In such case, there is a high chance there will be a need to revisit and update the definition again and again. This could tend to introduce errors and is also not friendly for internal teams when doing a quality check. Besides, such a manual way of creating design rules and corresponding DRC codes is time-consuming, error-prone and non-comprehensive particularly if there is a need to check a large number of devices and device information.

SUMMARY

Disclosed herein are embodiments of a system for automatically and systematically generating device-based design rules and corresponding device-based design rule checking (DRC) codes. The system can include memory. Stored information in the memory can include, but is not limited to, a list of definitions for different devices and a table of related data associated with the different devices. As discussed further in the detailed description section, the definitions on the list should be unique for each device and can be generated based on, for example, device construction information, regression suite database information, and production chip feedback information. The related data in the table can be, for example, maturity status information for the different devices, restriction status information for the different devices, or any other related data that may be relevant to device-based design rule generation. The system can further include a processor. This processor can access the stored information from the memory and can perform a method using the stored information. Specifically, based on the related data in the table, design rules associated with specific devices (e.g., for at least some of the different devices mentioned in the table) can be generated. Such design rules are referred to herein as device-based design rules and include rule descriptions that, for example, directly mention the specific devices by name or otherwise identify the specific devices instead of using design layers to represent devices. Then, based on specific definitions on the list and corresponding to the specific devices and further based on the design rules associated with the specific devices, design rule checking (DRC) codes associated with the specific devices can be generated. Such DRC checking codes are referred to herein as device-based DRC codes.

Also disclosed herein are embodiments of a method for automatically and systematically generating device-based design rules and corresponding device-based design rule checking (DRC) codes. The method can include accessing, by a processor, stored information from memory. The stored information can include, but is not limited to, a list of definitions for different devices and a table of related data associated with the different devices. As discussed further in the detailed description section, the definitions on the list should be unique for each device and can be generated based on, for example, device construction information, regression suite database information, and production chip feedback information. The related data in the table can be, for example, maturity status information for the different devices, restriction status information for the different devices, or any other related data that may be relevant to device-based design rule generation. The method can further include, based on the related data in the table, generating, by the processor, design rules associated with specific devices (e.g., for at least some of the different devices mentioned in the table). Such design rules are referred to herein as device-based design rules and include rule descriptions that, for example, directly mention the specific devices by name or otherwise identify the specific devices instead of using design layers to represent devices. The method can further include, based on specific definitions in the list and corresponding to the specific devices and further based on the design rules associated with the specific devices, generating, by the processor, design rule checking (DRC) codes associated with the specific devices. Such DRC checking codes are referred to herein as device-based DRC codes.

Finally, also disclosed herein are embodiments of a computer program product. This computer program product can include a non-transitory computer readable storage medium with program instructions embodied therewith (e.g., stored thereon). These program instructions can further be executable by a processor in order to cause the processor to perform the above-described methods.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 2 is an exemplary list unique definitions for different devices;

FIG. 3A is an exemplary table of maturity status information for different devices;

FIG. 3B is an exemplary table of restriction status information for different devices;

FIG. 4A illustrates exemplary maturity status-related device-based design rules;

FIG. 4B illustrates exemplary restriction status-related device-based design rules;

FIG. 5A illustrates exemplary maturity status-related device-based design rule checking (DRC) codes;

FIG. 5B illustrates exemplary restriction status-related device-based DRC codes;

FIG. 6A illustrates exemplary results of maturity status-related device-based DRC;

FIG. 6B illustrates exemplary results of restriction status-related device-based DRC;

DETAILED DESCRIPTION

Figure 1:
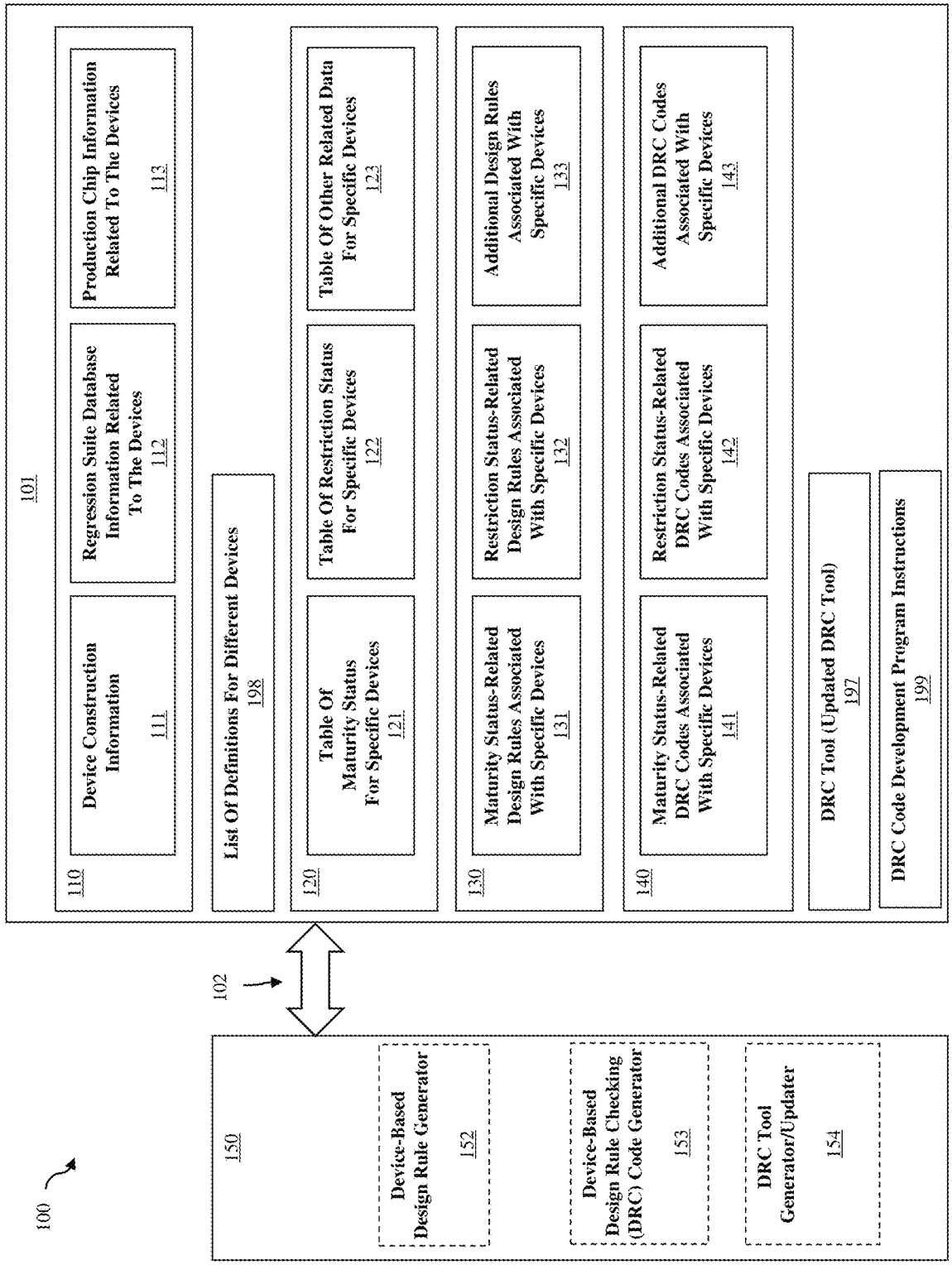
FIG. 1 is a schematic diagram illustrating embodiments of a system for automatically and systematically generating device-based design rules and corresponding device-based design rule checking (DRC) codes.

As mentioned above, there is a category of the design rules regarding specific devices to ensure such devices can function properly and meet certain standard of reliability (e.g., design rule to check prohibited layers over a certain device, or channel length of a certain device, etc.). Such rules are usually manually created in which the devices are represented by one layer or more layers with Boolean operations among the layers. The indirect way of representing devices create difficulties for the readers to understand. Besides, there is not a systematic way to represent devices in design rule descriptions. Two or more devices could be represented by one piece of definition consisted of several layers if they have same property to be checked. But if the property becomes different for these devices, the definition of these devices needs to be split. In such case, there is a high chance there will be a need to revisit and update the definition again and again. This could tend to introduce errors and is also not friendly for internal teams when doing a quality check. Besides, such a manual way of creating design rules and corresponding DRC codes is time-consuming, error-prone and non-comprehensive particularly if there is a need to check a large number of devices and device information.

In view of the foregoing, disclosed herein are embodiments of a system, a method and a computer program product for automatically and systematically generating device-based design rules and corresponding device-based design rule checking (DRC) codes. In the disclosed embodiments, design rules associated with specific devices (e.g., with at least some of the different devices potentially available for inclusion in an integrated circuit (IC) design at a given technology node) can be automatically and systematically generated based on at least one table of some type of related data associated with the different devices (e.g., maturity status information, restriction status information, or any other related data that may be relevant to device-based design rule generation). Based on the design rules associated with the specific devices and further based on unique definitions for the specific devices, design rule checking (DRC) codes associated with the specific devices can be automatically and systematically generated. By using this automatic and systematic approach, the disclosed embodiments facilitate the generation of more straight-forward, reader-friendly, comprehensive, and accurate device-based design rules and corresponding device-based DRC codes to ensure acceptable product reliability and yield. Furthermore, by using this automatic and systematic approach, the disclosed embodiments facilitate the relatively fast generation of such device-based design rules and DRC codes. Finally, in each of the disclosed embodiments, this automatic and systematic approach can be iteratively repeated (e.g., when the information used for generating unique definitions of devices changes and/or when the related data in the table and used for generating the design rules associated with specific devices changes) to update the device-based DRC codes and, thereby ensure DRC accuracy.

More particularly, referring to FIG. 1, disclosed herein are embodiments of a system 100 for automatically and systematically generating device-based design rules and corresponding device-based design rule checking (DRC) codes during development of and/or maintenance of a DRC tool (e.g., by a semiconductor foundry). The system 100 can include: one or more processors (e.g., see processor 150 and/or any of processors 152-154, detailed discussion below) and memory 101 including one or more computer readable storage mediums (e.g., one or more non-transitory computer readable storage devices) accessible by the processor(s).

The memory 101 can store program instructions 199 and other information (as discussed in greater detail below) required for automatically and systematically generating device-based design rules and corresponding device-based design rule checking (DRC) codes. For purposes of illustration, only a single computer readable storage medium is shown in FIG. 1; however, it should be understood that the program instructions 199 and other information required for automatically and systematically generating device-based design rules and corresponding device-based design rule checking (DRC) codes could be distributed throughout multiple different computer readable storage mediums accessible by the processor(s).

The system 100 can include a single specialized processor 150 (e.g., a single specialized processing unit) that performs (i.e., that is adapted to perform, that is configured to perform and/or that reads and executes the program instructions 199 to perform) the process steps required for generation of the device-based design rules and corresponding device-based DRC codes, as described in detail below. Alternatively, the system 100 can comprise multiple specialized processors (e.g., multiple different special specialized processing units) and each processor can perform (i.e., can be adapted to perform, can be configured to perform and/or can read and executes a subset of the program instructions 199 to perform) one or more of the multiple process steps required for generation of the device-based design rules and corresponding device-based DRC codes, as described in detail below. It should be understood that these multiple specialized processors could be co-located (e.g., on the same computer or server) or could be distributed throughout multiple computers and/or servers. For purposes of illustration, three different special purpose processor(s) are shown as options in FIG. 1 including a device-based design rule generator 152, a device-based design rule checking (DRC) code generator 153, and a DRC tool generator/updater 154. It should be understood that FIG. 1 is not intended to be limiting and, alternatively, the multiple process steps, as described in detail below, could be performed by any number of one or more processors.

The system 100 can also include a communication system 102. This communication system 102 can include, for example, system bus(es) (e.g., on computer(s) or server(s) containing the processor(s)) and, optionally, adapters to facilitate connection to a wired or wireless network and, thereby to facilitate communications with distributed system components.

As mentioned above, the memory 101 can store information required for automatically and systematically generating device-based design rules and corresponding device-based design rule checking (DRC) codes. This information can include technology node-specific background information 110.

The background information 110 can include device construction information 111 pertinent to all of the different devices potentially available for inclusion in an integrated circuit (IC) design, which is being developed for the technology node at issue and supported by the foundry. This device construction information 111 can include, but is not limited to, parameterized cell (pcell) information, layout information, marking layer information, design rule information, mask generation criteria information, and truth table information.

The background information 110 can include also include any regression suite database information 112 related to the different devices. More particularly, those skilled in the art will be consisted of various device test cases to ensure the unique device definitions can correctly recognize the expected devices. The device definitions created originally could be adjusted if cannot meet regression when run on the database.

The background information 110 can include also include any product chip feedback information 113 related to the different devices.

The stored background information 110 (including the device construction information 111, the regression suite database information 112, and/or the production chip feedback information 113) can be accessed (e.g., by a design rule developer) and, based on this background information 110, a list 198 of unique definitions for the different devices can be manually generated and stored in memory.

Generation of the list 198 of unique definitions for different devices can include, for example, first identifying which different devices should be considered unique for purposes of DRC. Specifically, different devices that should be considered unique for purposes of DRC can include both different types of devices and different variations of the same type of device. Specifically, different types of devices such as field effect transistors (FETs), bipolar junction transistors (BJTs), heterojunction bipolar transistors (HBT), diodes, resistors, etc. can be differentiated for purposes of DRC. Furthermore, within each category of device, further differentiation can be made. For example, FETs can be differentiated based on conductivity type (e.g., n-type FETs (NFETs) and p-type FETs (PFETs)). NFETs can further be differentiated based on optional NFET configurations including, for example, threshold voltage type (super low threshold voltage (SLVT), low threshold voltage (LVT), regular threshold voltage (RVT), high threshold voltage (HVT), and so on); gate dielectric thickness (e.g., thin gate oxide, medium thickness gate oxide, thick gate oxide, and so on); etc. Similarly, PFETs can further be differentiated based on optional PFET configurations including, for example, threshold voltage type (super low threshold voltage (SLVT), low threshold voltage (LVT), regular threshold voltage (RVT), high threshold voltage (HVT), and so on); gate dielectric thickness (e.g., thin gate oxide, medium thickness gate oxide, thick gate oxide, and so on); etc. Identification of devices that should be considered different devices for purposes of DRC. Similar differentiations can be made regarding other types of devices. Thus, for example, the different devices can include, but are not limited to, different threshold voltage-type n-type and p-type field effect transistors, different gate dielectric thickness n-type and p-type field effect transistors, different laterally-diffused n-type and p-type metal oxide semiconductor devices, different NPN-type and PNP-type bipolar junction transistors, different NPN-type and PNP-type heterojunction bipolar transistors, different bitcells, different resistors, different diodes, etc.

Generation of the list 198 of unique definitions for different devices can further include establishing the unique definitions for each device. To accomplish this, standard verification rule format (SVRF) script can be used to identify specific device key regions within an actual layout and distinguish from other device key regions. Additionally, the properties of each device can be captured by analyzing device-based information included in the device construction information 111 (i.e., included in the pcell information, layout information, marking layer information, design rule information, mask generation criteria information, and truth table information), included in the regression suite database information 112, and included in the production chip feedback information 113.

As mentioned above, this list 198 of unique definitions for the different devices can further be stored in memory 101 for future use. Furthermore, since the definitions on the list 198 are based on background information 110 (including device construction information 111, regression suite database information 112, and production chip feedback information 113) that may be periodically updated, generation and storage of list 198 can be iteratively repeated so that the definitions on the list 198 are as up-to-date and accurate as possible. For example, the unique device definition list 198 can be verified by the regression data suit and built into real tapeout system that can continuously get the feedback from real production chips devices information and could be adjusted to correctly catch the expected devices in real production chips. Thus, updating the list 198 can be accomplished using a combination of both manual and automatic processes.

FIG. 2 is an exemplary list 198 of unique definitions for different devices. As illustrated, the list identifies different devices (e.g., slvtnfet, slvtpfet, etc.) and, for each device, includes a definition specifying the unique properties of the device. For example, the definition for the slvtnfet indicates that this nFETGate (consists of an active silicon (RX) layer, a polysilicon gate conductor (PC) layer and an n-type doping implantation (JX) layer, defined in advance), that this nFETGate must have either SLVT marking layer or GY marking layer, but should not be covered by ESD marking layers or LVS_TRUE5T6T marking layer for 5-terminal or 6-terminal transistors.

As mentioned above, the memory 101 can store information required for automatically and systematically generating device-based design rules and corresponding device-based design rule checking (DRC) codes. This information can include one or more tables 120 of related data associated with the different devices. The related data in a given table could be, for example, maturity status information for the different devices, restriction status information for the different devices, or any other related data (e.g., device channel length information, device terminal connections information, etc.) that may be relevant to device-based design rule generation. Thus, for example, the memory 101 can store a table 121 of maturity status information for the different devices at different product grade levels and/or a table 122 of restriction status information for each of the different devices with respect to different design layers (i.e., layers drawn into the design layout) and/or each of the other devices.

For example, a table 121 of maturity status information for the different devices can include rows associated with the different devices, respectively. This table 121 can further include columns associated with different product grade levels. Each product grade level can have different reliability requirements and, thus, different qualification standards. A low grade level can have relatively low reliability requirements and qualification standards that less stringent, whereas a high grade level can have relatively high reliability requirements and qualifications standard that are more stringent. Thus, different types of requirements can be associated with the different grade levels. For example, general consumer products and internet of thing (IoT) devices (e.g., computers, mobile phones, wearables, etc.) may be associated with the lowest grade level; however, automotive vehicles with self-drive technology may be associated with the highest grade level to avoid catastrophic fails.

Each cell (i.e., input field) within the table 121 can include a maturity status indicator for a particular device at a particular grade level and this maturity status indicator can be either a qualified status indicator, which confirms that the particular device is fully qualified without restrictions to be incorporated into a product associated with the particular grade level (i.e., matured), or an unqualified status indicator, which indicates that the particular device is not fully qualified to be incorporated into a product associated with the particular grade level. Optionally, instead of using a single unqualified status indicator, any one of multiple different unqualified status indicators could be used including, but not limited to, any of the following: a qualified with restrictions indicator, which indicates that the particular device is qualified to be incorporated into a product associated with the particular grade level subject to certain restrictions; a frozen indicator, which indicates that the particular device is approaching qualification but has yet to be qualified for incorporation into a product associated with the particular grade level; a not offered indicator, which indicates that the particular device is currently not available through the foundry for incorporation into a product associated with the particular grade level; and an under development indicator, which indicates the particular device is still under development and has yet to be qualified for incorporation into a product associated with the particular grade level.

FIG. 3A is an exemplary table 121 of maturity status information for different devices (e.g., slvtnfet, slvtpfet, etc.). In this exemplary table 121, the product grade levels include a consumer grade level and multiple different automotive grade levels (e.g., ATV G1 and ATV G0) with the consumer grade having less stringent qualification standards than ATV G1 and ATV G1 having less stringent qualification standards than ATV G0. It should be noted that, for purposes of illustration, the table 121 as shown in FIG. 3A includes device-grade cells filled in with natural language text-type indicators (e.g., qualified, qualified (restricted), frozen, etc.). However, it should be understood that this exemplary table is not intended to be limiting. Alternatively, such a table 121 could include device-grade cells filled in with alternative types of indicators (e.g., numbers, letters, symbols, etc. corresponding to the different indicators described above).

For example, another table 122 of restriction status information for the different devices can similarly include rows associated with the different devices, respectively. This table 122 can further include columns associated with different design layers (i.e., layers drawn by designers into the design layout) and/or different devices. The design layers can include, for example, an Nwell, an active silicon (RX) layer, a polysilicon gate conductor (PC) layer, a triple well (T3) layer, etc. In this case, each cell at the intersection of a row and column (i.e., each input field) within the table 122 can include a restriction status indicator for the particular device, which is associated with the row, with respect to either a particular design layer or another particular device, which is associated with the column. This restriction status indicator can be, for example, any of the following: a prohibited status indicator, which indicates that the particular device is prohibited from touching the particular design layer or another particular device; an allowed status indicator, which indicates the particular device is allowed to touch the particular design layer or the other particular device; and a neutral status indicator (also referred to herein as a don't care indicator), which indicates that touching between the particular device and the particular design layer or the other particular device is irrelevant.

FIG. 3B is an exemplary table 122 of restriction status information for different devices (e.g., slvtnfet, slvtpfet, etc.) in the rows. In this exemplary table 122, a "0" represents a prohibited status indicator, which indicates that the particular device is prohibited from touching the particular design layer; a "1" represents an allowed status indicator, which indicates the particular device is allowed to touch the particular design layer; and an "x" represents a neutral status indicator (also referred to herein as a don't care indicator), which indicates that touching between the particular device and the particular design layer is irrelevant. It should be noted that, for purposes of illustration, the table 122 as shown in FIG. 3B includes device-layer cells filled in with a combination of numbers and letters (e.g., 1, 0 and x). However, it should be understood that this exemplary table is not intended to be limiting. Alternatively, such a table 122 could include device-layer cells filled in with alternative types of indicators (e.g., with natural language text-type indicators).

Additionally, it should be understood that the types of tables described above and illustrated in FIGS. 3A-3B are not intended to be limiting. Alternatively, the memory 101 could store one or more additional table(s) 123 of any other type of related data for the different devices that could be considered relevant in terms of finished product reliability and/or yield (e.g., device channel length information, device terminal connections information, etc.).

Furthermore, it should be understood that such tables can be periodically updated as new information becomes available. For example, table 121 can be updated if an under development status changes to qualified or otherwise restricted; table 122 can be updated if a neutral status changes to a prohibited status, etc.

The processor 150 (or, alternatively, a specialized processor, such as a device-based design rule generator 152) can access (e.g., can read and execute program instructions causing it to access) the stored related data associated with the different devices in one or more of the tables 121-123 and, based on this data, can generate and store in memory (e.g., can execute program instructions causing it to generate and store in memory) design rules 130 associated with specific devices (e.g., for at least some of the different devices noted in a table). Such design rules are referred to herein as device-based design rules and include rule descriptions that, for example, directly mention the specific devices by name or otherwise identify the specific devices instead of using design layers to represent devices.

For example, based on table 121, generated and stored maturity status-related device-based design rules 131 can be associated with all device-grade level cell entries where an unqualified status is indicated. Specifically, each of the maturity status-related device-based design rules can include a rule description that specifies a particular grade level and that also specifies, by name or other identifier, all of the different devices that are not fully qualified at that the particular grade level, as indicated by the table 121. Optionally, if multiple different unqualified status indicators are used in the table 121, then each maturity status-related device-based design rule can specify a particular grade level and a particular unqualified status (e.g., qualified with restrictions, frozen, not offered, or under development) and can specify all the different devices having the particular unqualified status at that particular grade level, as indicated by the table. For example, as illustrated in FIG. 4A, one design rule can be generated for frozen at ATV G1 and can specify all devices that are as frozen at ATV G1, as indicated by the table 121; another design rule can be generated for not offered at ATV G1 and can specify all devices not offered at ATV G1, as indicated by the table 121; yet another design rule can be generated for qualified with restrictions at ATV G1 and can specify all devices that are qualified with restrictions at ATV G1, as indicated by the table 121; yet another design rule can be generated for under development at ATV G0 and can specify all devices that are under development at ATV G0, as indicated by table 121; and so on until all of the unqualified status and grade level combinations are comprehensively covered by the resulting design rules.

Similarly, based on table 122, generated and stored restriction status-related device-based design rules 132 can be associated with all devices having a restricted status with respect to any design layer or with respect to any other device. Specifically, each of the restriction status-related device-based design rules can include a rule description that specifies a particular device by name or other identifier and that further specifies all of the different design layers or other devices that are prohibited from touching the particular device, as indicated by table 122. For example, as illustrated in FIG. 4B, one design rule can be generated for slvtnfets and can specify all design layers and other devices prohibited from touching a slvtnfet, as indicated by table 122; another design rule can be generated for avtnfets and can specify all design layers and other devices prohibited from touching an avtnfet as indicated by table 122; and so on until all of combinations are comprehensively covered by the resulting design rules.

It should be understood that additional design rules 133 associated with the specific devices could be similarly generated and stored in memory 101 based on corresponding tables 123.

The processor 150 (or, alternatively, a specialized processor, such as a device-based DRC code generator 153) can access (e.g., can read and execute program instructions causing it to access) the stored device-based design rules 130 and the list 198 of definitions and, based on the design rules and the definitions, can generate and store in memory 101 (e.g., can execute program instructions causing it to generate and store in memory) design rule checking (DRC) codes 140 associated with the same specific devices. Such DRC codes are referred to herein as device-based DRC codes.

For example, maturity status-related device-based DRC codes 141 associated with specific devices can be generated based on the maturity status-related device-based design rules 131, respectively, associated with those same specific devices and further based on the unique definitions of those devices mentioned in design rules 131. For example, as illustrated in FIG. 5A, one group of DRC codes can apply to (A) all ATV G1 and can include: (1) a DRC code, which specifies that the slvtnfet is frozen at ATV G1 and which includes the unique definition for the slvtnfet acquired from the list 198, so any slvtnfet used in a layout for ATV G1 will be flagged; (2) another DRC code, which specifies that the mdsrnfetw1_atv0 is frozen at ATV G1 and which includes the unique definition for the device mdsrnfetw1_atv0 acquired from the list 198, so any mdsrnfetw1_atv0 used in a layout for ATV G1 will be flagged; and so on.

Similarly, restriction status-related device-based DRC codes 142 associated with specific devices can be generated based on the restriction status-related device-based design rules 132, respectively, associated with those same specific devices and further based on the unique definitions of those devices mentioned in design rules 132. In this case, for example as illustrated in FIG. 5B, one group of DRC codes can apply (A) to all slvtnfets, with the slvtnfet being defined per the list 198, and can include: (1) a DRC code, which specifies that the slvtnfet is prohibited from touching an Nwell (NW), so that any slvtnfet that touches an Nwell in a layout will be flagged; (2) another DRC code, which specifies that slvtnfet is prohibited from touching an LVT, so that any slvtnfet that touches an LVT in a layout will be flagged; and so on.

It should be understood that additional device-based DRC codes associated with specific devices 143 could be similarly generated and stored in memory 101 based on design rules 133 and further based on the unique definitions of devices mentioned in those design rules 133.

The processor 150 (or, alternatively, a specialized processor, such as a DRC tool generator/updater 154) can further load (e.g., can read and execute program instructions causing it to load) the device-based DRC codes into a DRC tool 197 (e.g., of a process design kit (PDK)). Those skilled in the art will recognize DRC tools are software tools specifically configured to run DRC using DRC codes.

Figure 7:
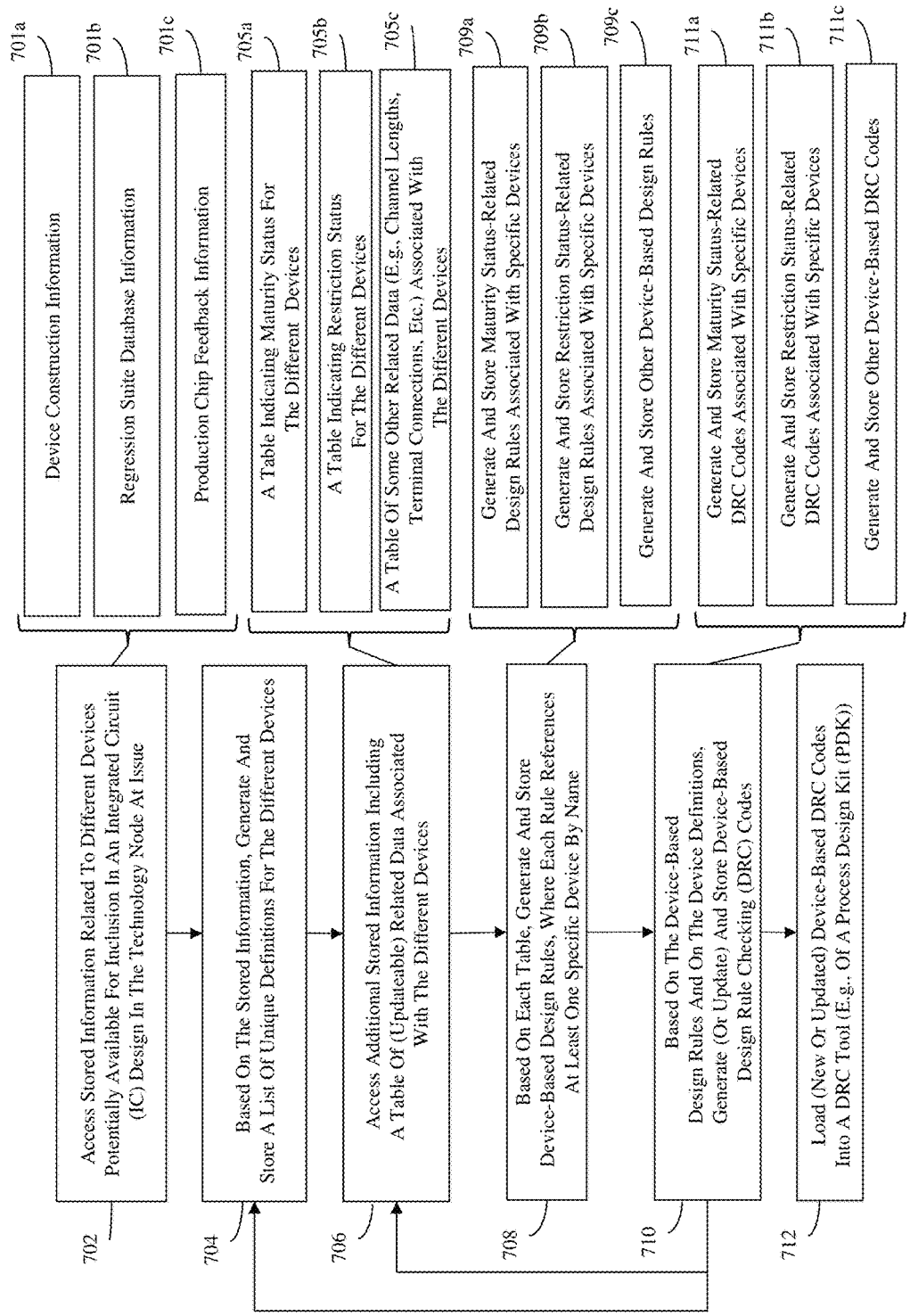
FIG. 7 is a flow diagram illustrating disclosed embodiments of a method for automatically and systematically generating device-based design rules and corresponding device-based design rule checking (DRC) codes during development of and/or maintenance of a DRC tool (e.g., by a semiconductor foundry)

FIG. 7 is a flow diagram illustrating disclosed embodiments of a method for automatically and systematically generating device-based design rules and corresponding device-based design rule checking (DRC) codes during development of and/or maintenance of a DRC tool (e.g., by a semiconductor foundry).

Referring to FIG. 7 in combination with the system 100 of FIG. 1, at least one processor (e.g., 150 or 152-154) can read and execute program instructions 199 stored in memory 101 and these program instructions 199 can cause the processor(s) to perform one or more of the following steps in a method for automatically and systematically generating device-based design rules and corresponding device-based design rule checking (DRC) codes.

The method can include accessing (e.g., by a design rule developer) stored information from the memory 101 (see process 702). The stored information can include, but is not limited to, technology node-specific background information 110, as discussed in greater detail above. The background information 110 can include device construction information 111 pertinent to all of the different devices potentially available for inclusion in an integrated circuit (IC) design, which is being developed for the technology node at issue and supported by the foundry (see item 701a). This device construction information 111 can include, but is not limited to, parameterized cell (pcell) information, layout information, marking layer information, design rule information, mask generation criteria information, and truth table information. The background information 110 can include also include any regression suite database information 112 related to the different devices (see item 701b). The background information 110 can include also include any product chip feedback information 113 related to the different devices (see item 701c).

The method can further include, based on this background information 110, generating (e.g., manually by the design rule developer) a list 198 of unique definitions for the different devices (see process 704). Process 704 can include, for example, first identifying the different devices that should be considered unique for purposes of DRC. The different devices that should be recognized unique for purposes of DRC can include both different types of devices and different variations of the same type of device (as discussed in greater detail above with regard to the system embodiment). Process 704 can further include using standard verification rule format (SVRF) script to identify specific device key regions within an actual layout and distinguish from other device key regions. Process 704 can also include capturing the unique properties of each device by analyzing device-based information included in the device construction information (i.e., included in the pcell information, layout information, marking layer information, design rule information, mask generation criteria information, and truth table information), included in the regression suite database information, and included in the production chip feedback information.

The method can further include storing the list 198 in memory 101 for future use. Furthermore, since the definitions of the devices on the list 198 are based on background information (including device construction information, regression suite database information, and production chip feedback information) that may be periodically updated, the processes of generating and storing the list 198 can be iteratively repeated so that the definitions contained in the list 198 are as up-to-date and accurate as possible. As discussed in greater detail above with regard to the system embodiment, FIG. 2 is an exemplary list of definitions for different devices that could be generated and stored at process 704.

The method can further include accessing additional stored information from memory 101 (see process 706). This additional stored information can include one or more tables 120 of related data associated with the different devices. The related data in a given table could be, for example, maturity status information for the different devices, restriction status information for the different devices, or any other related data (e.g., device channel length information, device terminal connections information, etc.) that may be relevant to device-based design rule generation. Thus, for example, the memory 101 can store a table 121 of maturity status information for the different devices at different product grade levels (e.g., as shown in FIG. 3A and discussed in detail above) (see item 705a), a table 122 of restriction status information for each of the different devices with respect to different design layers and/or each of the other devices (e.g., as shown in FIG. 3B and discussed in detail above) (see item 705b), or any other table 123 of related data associated with the different devices (see item 705c). It should be understood that such tables can be periodically updated as new information becomes available. For example, table 121 can be updated if an under development status changes to qualified or otherwise restricted; table 122 can be updated if a neutral status changes to a prohibited status, etc.

The method can further include, based on the related data associated with the different devices and contained in a given one of the tables 120, generating and storing in memory 101 device-based design rules 130 (i.e., design rules associated with specific devices) (see process 708). Such device-based design rules include rule descriptions that, for example, directly mention the specific devices by name or other identifier instead of using design layers to represent devices. For example, maturity status-related device-based design rules can be generated and stored at process 708 based on the data contained in table 121; restriction-status related device-based design rules can be generated and stored at process 708 based on the data contained in table 122; etc.

Specifically, maturity status-related device-based design rules 131 generated and stored at process 708 can be associated with all device-grade level cell entries with an unqualified status (see item 709a). Each of the maturity status-related device-based design rules can include a rule description that specifies a particular grade level and that also specifies by name or other identifier all of the different devices that are not fully qualified at that the particular grade level, as indicated by the table 121. Optionally, if multiple different unqualified status indicators are used in the table 121, then each maturity status-related device-based design rule can specify a particular grade level and a particular unqualified status (e.g., qualified with restrictions, frozen, not offered, or under development) and can specify all the different devices having the particular unqualified status at that particular grade level, as indicated by the table. For example, as illustrated in FIG. 4A, one design rule can be generated for frozen at ATV G1 and can specify all devices that are as frozen at ATV G1, as indicated by the table 121; another design rule can be generated for not offered at ATV G1 and can specify all devices not offered at ATV G1, as indicated by the table 121; yet another design rule can be generated for qualified with restrictions at ATV G1 and can specify all devices that are qualified with restrictions at ATV G1, as indicated by the table 121; yet another design rule can be generated for under development at ATV G0 and can specify all devices that are under development at ATV G0, as indicated by table 121; and so on until all of the unqualified status and grade level combinations are comprehensively covered by the resulting design rules.

Similarly, restriction status-related device-based design rules 132 generated and stored at process 708 can be associated with all devices having a restricted status with respect to any design layer or with respect to any other device (see item 709b). Each of the restriction status-related device-based design rules can include a rule description that specifies a particular device by name or other identifier and that further specifies all of the different design layers or other devices that are prohibited from touching the particular device, as indicated by table 122. For example, as illustrated in FIG. 4B, one design rule can be generated for slvtnfets and can specify all design layers and other devices prohibited from touching a slvtnfet, as indicated by table 122;

another design rule can be generated for avtnfets and can specify all design layers and other devices prohibited from touching an avtnfet as indicated by table 122; and so on until all of combinations are comprehensively covered by the resulting design rules.

It should be understood that at process 708 additional device-based design rules 133 associated with specific devices could be similarly generated and stored in memory 101 based on the data containing in any additional table 123 (see item 709*c*).

The method can further include accessing the device-based design rules 130 (previously generated and stored in memory at process 708) and also accessing the list 198 of definitions (previously generated and stored in memory at process 704) and, based on the device-based design rules and the definitions of the devices referenced in the design rules, generating and storing in memory 101 corresponding device-based design rule checking (DRC) codes 140 (see process 710).

For example, at process 710 maturity status-related device-based DRC codes 141 can be generated based on the maturity status-related device-based design rules 131, respectively, and further based on the unique definitions of those devices mentioned in design rules 131 (see item 711*a*). For example, as illustrated in FIG. 5A, one group of DRC codes can apply to (A) all ATV G1 and can include: (1) a DRC code, which specifies that the slvtnfet is frozen at ATV G1 and which includes the unique definition for the slvtnfet acquired from the list 198, so that any slvtnfet used in a layout for ATV G1 will be flagged; (2) another DRC code, which specifies that the mdsrnfetw1_atv0 is frozen at ATV G1 and which includes the unique definition for the device mdsrnfetw1_atv0 acquired from the list 198, so that any mdsrnfetw_1atv0 used in a layout for ATV G1 will be flagged; and so on.

Similarly, at process 710 restriction status-related device-based DRC codes 142 can be generated based on the restriction status-related device-based design rules 132, respectively, and further based on the unique definitions of those devices mentioned in design rules 132 (see item 711*b*). In this case, for example as illustrated in FIG. 5B, one group of DRC codes can apply (A) to all slvtnfets, with the slvtnfet being defined per the list 198, and can include: (1) a DRC code, which specifies that the slvtnfet is prohibited from touching an Nwell (NW), so that any slvnfet touching an Nwell in a layout will be flagged; (2) another DRC code, which specifies that slvtnfet is prohibited from touching an LVT, so that any slvtnfet touching an LVT in a layout will be flagged; and so on.

It should be understood that at process 710 additional device-based DRC codes 143 associated with specific devices could be similarly generated and stored in memory 101 based on device-based design rules 133 and further based on the unique definitions of devices mentioned in those design rules 133 (see item 711*c*).

The method can further include loading the device-based DRC codes into a DRC tool 197 (e.g., of a process design kit (PDK)) (see process 712). Those skilled in the art will recognize DRC tools are software tools specifically configured to run DRC using DRC codes.

The method can further include running the DRC tool 197 in order to apply the device-based DRC codes. Those skilled in the art will recognize that a DRC tool can be configured to receive or access a layout (e.g., in GDSII format) of an IC design, to analyze the layout with respect to a list of device-based DRC codes, and to output a corresponding list of DRC results. The list of DRC results can identify specific device-based DRC codes, can specify the number of violations detected for each of the device-based DRC codes, and can flag any of the device-based DRC codes that have been violated and further indicate the location in the layout of the flagged DRC code violation.

Figures 6A, 6B:
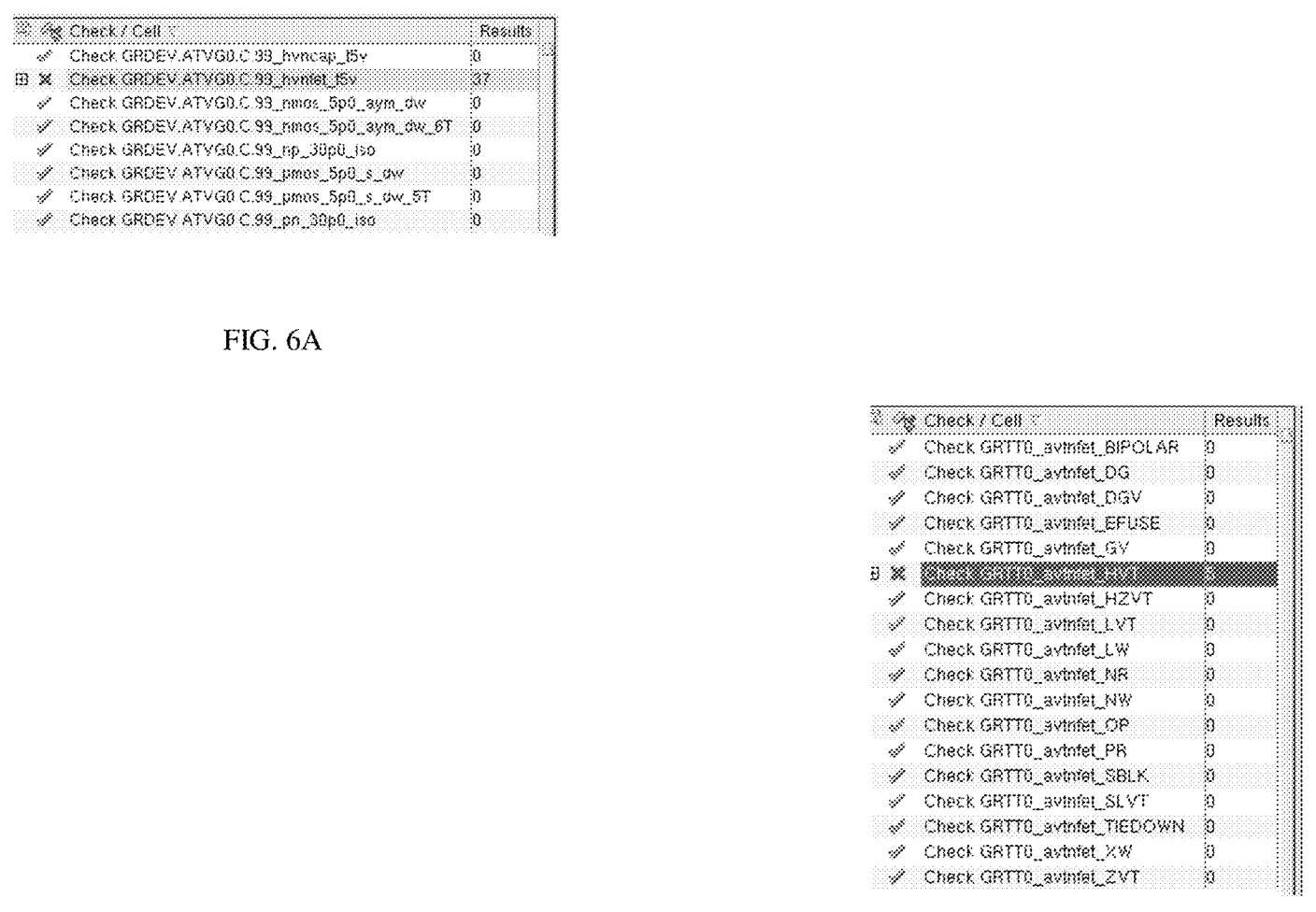

For example, FIG. 6A is a screen shot of an exemplary list of DRC results from device-based maturity status-related DRC of an ATV G0 grade level product under design. This exemplary list of DRC results refers to maturity status related DRC codes, which were generated for specific devices previously identified as being under development at the ATV G0 grade level. This exemplary list of DRC results specifies the number of violations detected for each of the DRC codes and flags any DRC codes that were violated. In this case only one DRC code was flagged for being violated. The flagged DRC code specifies that the device hvtnfet_15v is under development at the ATV G0 grade level and it was flagged because 37 instances of hvtnfet_5v were detected in the layout for the ATV G0 grade level product under design.

For example, FIG. 6B is a screen shot of an exemplary list of DRC results from device-based restriction status-related DRC of a product under design. This exemplary list of DRC results refers to restriction status related DRC codes, which were generated for a specific device (namely the avtnfet) and which specify design layers or other devices (e.g., bipolar, DG, DGV, Efuse, etc.) that are prohibited from touching the avtneft. This exemplary list of DRC results specifies the number of violations detected for each of the DRC codes and flags any DRC codes that were violated. In this case only one DRC code was flagged. The flagged DRC code specifies that the avtnfet is prohibited from touching HVT devices and it was flagged because 5 instances of avtnfet to HVT touching were detected in the layout for the product under design.

Those skilled in the art will recognize that, during DRC, flagging a particular DRC code violation notifies the designer of a product that the violation has occurred. The designer or an automated design program may or may not alter the design given the violation. The decision protocol for altering the design based on a device-based DRC code violation can consider factors including, but not limited, number of detected violations, critical/non-critical location of detected violations, type of detected violation, etc. For example, if a device-based maturity status-related DRC code violation is directed to an under development restriction status, the designer may choose until a finalized restriction status is determined before making any alternations to the design; if a device-based maturity status-related DRC code violation is directed to a qualified but restricted restriction status, the designer may determine whether the restrictions are met before making alterations to the design; and so on.

Following iterative IC design processing, including the application of device-based DRC codes during DRC, a final design structure can be generated. The design structure may also employ a data format used for the exchange of layout data of integrated circuits and/or symbolic data format (e.g., information stored in a GDSII (GDS2), GL1, OASIS, map files, or any other suitable format for storing such design data structures). The design structure may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a product (e.g., at a specific one of the grade levels discussed above). The design structure may then proceed to tape-out, be released to manufacturing (e.g., fabrication of the IC according to the final IC design checked using device-based DRC codes), be released to a mask house, be sent to another design house, be sent back to the customer, etc.

By using this automatic and systematic approach, the disclosed embodiments facilitate the generation of more straight-forward, reader-friendly, comprehensive, and accurate device-based design rules and corresponding device-based DRC codes to ensure acceptable product reliability and yield. Furthermore, by using this automatic and systematic approach, the disclosed embodiments facilitate the relatively fast generation of such device-based design rules and corresponding device-based DRC codes. Finally, in each of the disclosed embodiments, this automatic and systematic approach can be iteratively repeated (e.g., when the information used for generating unique definitions of devices changes and/or when the related data in the table and used for generating the design rules associated with specific devices changes) to update the device-based DRC codes and, thereby ensure DRC accuracy.

Also disclosed herein are embodiments of a computer program product. This computer program product can include a non-transitory computer readable storage medium with program instructions embodied therewith (e.g., stored thereon). These program instructions can further be executable by a processor in order to cause the processor to perform the above-described methods. More particularly, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 8:
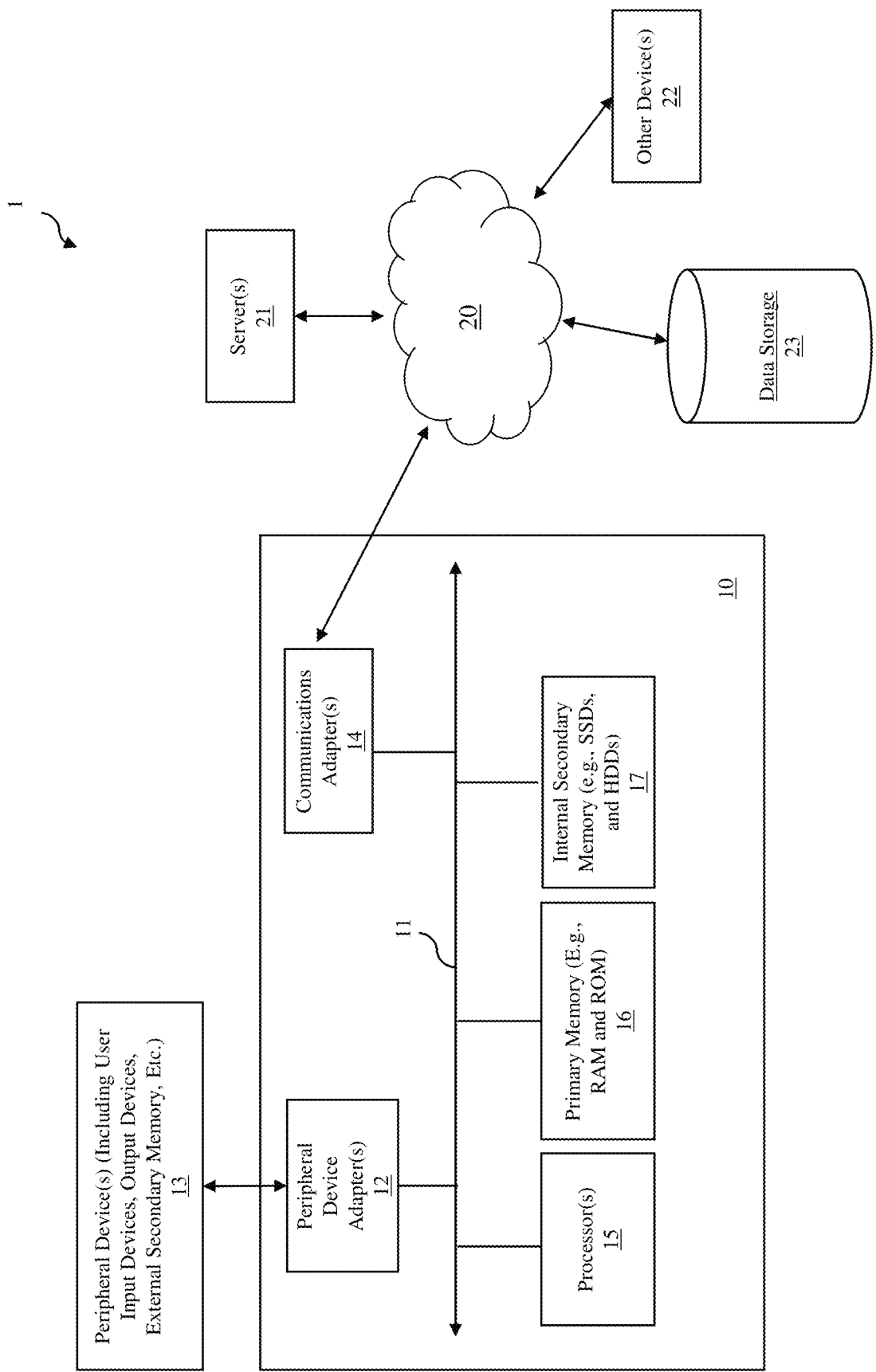
FIG. 8 is a schematic diagram illustrating and exemplary hardware environment for implementing aspects of the disclosed embodiments.

An exemplary hardware environment 1 for implementing aspects of the disclosed embodiments is depicted in FIG. 8. Generally, the hardware environment can include at least one computing device 10 (also referred to herein as a computer). The computer 10 can be, for example, a desktop, laptop, tablet, mobile computing device, etc. The computer 10 can include at least one bus 11. The bus 11 can be connected to various other components of the computer 10 and can be configured to facilitate communication between those components.

The computer 10 can include various adapters. The adapters can include one or more peripheral device adapters 12, which are configured to facilitate communications between one or more peripheral devices 13, respectively, and the bus 11. The peripheral devices 13 can include user input devices configured to receive user inputs. User input devices can include, but are not limited to, a keyboard, a mouse, a microphone, a touchpad, a touchscreen, a stylus, bio-sensor, a scanner, or any other type of user input device. The peripheral devices 13 can also include additional input devices, such as external secondary memory devices (as discussed in greater detail below). The peripheral devices 13 can also include output devices. The output devices can include, but are not limited to, a printer, a monitor, a speaker, or any other type of computer output device. The adapters can include one or more communications adapters 14 (also referred to herein as a computer network adapters), which are configured to facilitate communications between the computer 10 and one or more communications networks 20 (e.g., a wide area network (WAN), a local area network (LAN), the internet, a cellular network, a Wi-Fi network, etc.). Such network(s) 20 can, in turn, facilitate communications between the computer 10 and other system components on the network: remote server(s) 21, other device(s) 22 (e.g., computers, laptops, tablets, mobile phones, etc.), remote data storage 23, etc.

The computer 10 can further include at least one processor 15 (also referred to herein as a central processing units (CPU)). Optionally, each CPU 15 can include a CPU cache. Each CPU 15 can be configured to read and execute program instructions.

The computer 10 can further include memory and, particularly, computer-readable storage mediums. The memory can include primary memory 16 and secondary memory. The primary memory 16 can include, but is not limited to, random access memory (RAM) (e.g., volatile memory employed during execution of program operations) and read only memory (ROM) (e.g., non-volatile memory employed during start-up). The RAM can include, but is not limited to, dynamic random access memory (DRAM), static random access memory (SRAM), or any other suitable type of RAM. The ROM can include, but is not limited to, erasable programmable read only memory (EPROM), flash memory, electronically erasable programmable read only memory (EEPROM), programmable read only memory (PROM), or any other suitable type of ROM. The secondary memory can be non-volatile. The secondary memory can include internal secondary memory 17, such as internal solid state drive(s) (SSD(s)) and/or internal hard disk drive(s) (HDD(s)), installed within the computer 10 and connected to the bus 11. The secondary memory can also include external secondary memory connected to or otherwise in communication with the computer 10 (e.g., peripheral devices). The external secondary memory can include, for example, external/portable SSD(s), external/portable HDD(s), flash drive (s), thumb drives, compact disc(s) (CD(s)), digital video disc(s) (DVD(s)), network-attached storage (NAS), storage area network (SAN), or any other suitable non-transitory computer-readable storage media connected to or otherwise in communication with the computer 10. The different functions of primary and secondary memory are well known in the art and, thus, the details thereof have been omitted from this specification in order to allow the reader to focus on the salient aspects of the disclosed embodiments.

In some embodiments, program instructions for performing the disclosed method or a portion thereof, as described above, can be embodied in (e.g., stored in) secondary memory accessible by the computer 10. When the program instructions are to be executed (e.g., in response to user inputs to the computer 10), required information (e.g., the program instructions and other data) can be loaded into the primary memory (e.g., stored in RAM). The CPU 15 can read the program instructions and other data from the RAM and can execute the program instructions. In other embodiments, a client-server model can be employed. In this case, the computer 10 can be a client and a remote server 21 in communication with the computer 10 over a network 20 can provide, to the client, a service including execution of program instructions for performing the disclosed method or a portion thereof, as described above, in response to user inputs the computer 10.

It should be understood that the above-described exemplary hardware environment is not intended to be limiting. Alternatively, any other suitable hardware for implementing aspects of the disclosed systems, methods and computer program products could be employed.

Additionally, it should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
    memory storing information comprising at least: a list of definitions for different devices, and a table of related data associated with the different devices; and
    at least one processor accessing the information from the memory and performing a method, wherein the method comprises:
        based on the related data in the table, generating device-based design rules associated with specific devices of the different devices; and
        based on specific definitions in the list and corresponding to the specific devices and further based on the device-based design rules, generating device-based design rule checking codes associated with the specific devices.

2. The system of claim 1,
    wherein the information further comprises device construction information, regression suite database information, and production chip feedback information related to the different devices,
    wherein the device construction information comprises any of parameterized cell information, layout information, marking layer information, design rule information, mask generation criteria information, and truth table information, and
    wherein the method further comprises:
        accessing the device construction information, the regression suite database information, and the production chip feedback information; and
        based on the device construction information, the regression suite database information, and the production chip feedback information, generating the list of the definitions for the different devices.

3. The system of claim 2, wherein the method further comprises updating the design rule checking codes associated with the specific devices based on changes to the information.

4. The system of claim 1, wherein the different devices comprise any of different types of devices and different variations of a given device.

5. The system of claim 1, wherein the related data in the table comprises maturity status information for the different devices and wherein the maturity status information comprises: for each device, maturity status indicators for each of multiple different grade levels.

6. The system of claim 5, wherein each maturity status indicator for each cell in the table comprises one of a qualified status indicator and an unqualified status indicator.

7. The system of claim 1, wherein the related data in the table comprises restriction status information for the different devices and wherein the restriction status information comprises: for each device, restriction status indicators for different layers or components.

8. The system of claim 1, wherein the related data in the table comprises device channel lengths information.

9. The system of claim 1, wherein the related data in the table comprises device terminal connections information.

10. A method comprising:
    accessing, by a processor from memory, information comprising at least: a list of definitions for different devices, and a table of related data associated with the different devices;
    based on the related data in the table, generating, by the processor, device-based design rules associated with specific devices of the different devices; and
    based on specific definitions in the list and corresponding to the specific devices and further based on the device-based design rules, generating, by the processor, device-based design rule checking codes associated with the specific devices.

11. The method of claim 10,
    wherein the information further comprises device construction information, regression suite database information, and production chip feedback information related to the different devices,
    wherein the device construction information comprises any of parameterized cell information, layout information, marking layer information, design rule information, mask generation criteria information, and truth table information, and
    wherein the list of definitions for the different devices is generated based on the device construction information, the regression suite database information, and the production chip feedback information.

12. The method of claim 11, wherein the method further comprises updating, by the processor, the design rule checking codes associated with the specific devices based on changes to the information.

13. The method of claim 10, wherein the different devices comprise any of different types of devices and different variations of a given device.

14. The method of claim 10, wherein the related data in the table comprises maturity status information for the different devices and wherein the maturity status information comprises: for each device, maturity status indicators for each of multiple different grade levels.

15. The method of claim 14, wherein each maturity status indicator for each cell in the table comprises one of a qualified status indicator and an unqualified status indicator.

16. The method of claim 10, wherein the related data in the table comprises restriction status information for the different devices and wherein the restriction status information comprises: for each device, restriction status indicators for multiple layers or components.

17. The method of claim 10, wherein the related data in the table comprises device channel length information.

18. The method of claim 10, wherein the related data in the table comprise device terminal connections information.

19. The method of claim 10, further comprising loading, by the processor, the design rule checking codes associated with the specific devices into a design rule checking tool for application during design rule checking to improve product reliability and yield.

20. A computer program product comprising a non-transitory computer readable storage medium having program instructions embodied therewith, wherein the program instructions are executable by a processor to cause the processor to perform a method, and wherein the method comprises:

accessing information comprising at least: a list of definitions for different devices, and a table of related data associated with the different devices;

based on the related data in the table, generating device-based design rules associated with specific devices of the different devices; and based on specific definitions in the list and corresponding to the specific devices and further based on the device-based design rules, generating design rule checking codes associated with the specific devices.

* * * * *